United States Patent
Joung et al.

(10) Patent No.: US 9,000,959 B2
(45) Date of Patent: Apr. 7, 2015

(54) TURBO ENCODER APPARATUS

(75) Inventors: Jinsoup Joung, Seongnam-si (KR); Joohyeong Lee, Seoul (KR); Jongho Lim, Seoul (KR); Seungkeun Yook, Seoul (KR); Ji Hye Shin, Seoul (KR)

(73) Assignee: InnoWireless Co., Ltd. (KR)

( * ) Notice: Subject to any disclaimer, the term of this patent is extended or adjusted under 35 U.S.C. 154(b) by 0 days.

(21) Appl. No.: 14/370,565

(22) PCT Filed: Feb. 24, 2012

(86) PCT No.: PCT/KR2012/001439
§ 371 (c)(1),
(2), (4) Date: Jul. 3, 2014

(87) PCT Pub. No.: WO2013/108952
PCT Pub. Date: Jul. 25, 2013

(65) Prior Publication Data
US 2014/0375485 A1    Dec. 25, 2014

(30) Foreign Application Priority Data

Jan. 20, 2012    (KR) .................. 10-2012-0006617

(51) Int. Cl.
*H03M 13/00* (2006.01)
*H03M 13/47* (2006.01)
(Continued)

(52) U.S. Cl.
CPC ............ *H03M 13/47* (2013.01); *H03M 13/235* (2013.01); *H03M 13/2903* (2013.01); *H03M 13/2957* (2013.01); *H03M 13/2993* (2013.01); *H03M 13/6575* (2013.01)

(58) Field of Classification Search
CPC ............ H03M 13/2957; H03M 13/2771; H03M 13/258; H03M 13/2963; H03M 13/256; H03M 13/27; H03M 13/2725; H03M 13/47

USPC ................. 341/94, 50, 51; 714/786
See application file for complete search history.

(56) References Cited

U.S. PATENT DOCUMENTS 6,862,707 B2 *  3/2005  Shin .............. 714/786
2002/0056065 A1  5/2002  Jung et al.
(Continued)

FOREIGN PATENT DOCUMENTS

| KR | 1019980012889 | 4/1998 |
|----|---------------|--------|
| KR | 1020010008096 | 2/2001 |

(Continued)

OTHER PUBLICATIONS

International Search Report—PCT/KR2012/001439 dated Dec. 26, 2012.

*Primary Examiner* — Jean B Jeanglaude
(74) *Attorney, Agent, or Firm* — Cantor Colburn LLP

(57) ABSTRACT

A turbo encoder apparatus includes: a first element encoder for receiving an input of a bitstream of the data, encoding the input of the bitstream of the data, and generating a first output bitstream in an unit of plural bits; an internal interleaver for generating an interleaved input bitstream from the bitstream of the data; a second element encoder for receiving an input of the interleaved input bitstream in the unit of plural bits, encoding the input of the interleaved input bitstream, and generating a second output bitstream in an unit of plural bits; a trellis-termination-encoder for generating bits for trellis terminations of the first element encoder and the second element encoder; and a bitstream assembler for receiving the first output bitstream, the second output bitstream, and the bits for the trellis terminations and generating an input bitstream for a rate matching.

7 Claims, 5 Drawing Sheets

(51) Int. Cl.
*H03M 13/23* (2006.01)
*H03M 13/29* (2006.01)

(56) References Cited

U.S. PATENT DOCUMENTS

2007/0092033 A1 4/2007 Yu et al.
2008/0112502 A1* 5/2008 Limberg ..................... 375/295
2008/0225965 A1 9/2008 Pi et al.
2009/0106618 A1 4/2009 Lin
2010/0322358 A1* 12/2010 Drumm et al. ................ 375/341

FOREIGN PATENT DOCUMENTS

| KR | 1020070112326 | 11/2007 |
| KR | 1020090125080 | 12/2009 |

* cited by examiner

*Prior Art*

Size = C + F = $M_8$ * 8 = K

Size = $N_8 * 8$,
$F = N_8 * 8 - (K + 4)$

TURBO ENCODER APPARATUS

TECHNICAL FIELD

The present invention relates to a turbo encoder apparatus, and more particularly to a turbo encoder apparatus using an improved signal processing method in order to enhance a speed of a turbo encoder used in a channel coding technology.

BACKGROUND ART

In general, a channel coding such as a turbo coding is used to increase the transmission efficiency of data in a communication system.

FIG. 1 is a block diagram illustrating a construction of a conventional turbo encoder. Referring to FIG. 1, the conventional turbo encoder 100 includes an internal interleaver 110 and two 8-state element encoders 120 and 130.

The conventional turbo encoder 100 performs a channel coding by using a Parallel Concatenated Convolutional Code (PCCC).

A transfer function of the 8-state element encoders 120 and 130 is defined as follows.

$$G(D)=[1,g_1(D)/g_0(D)]^{g_0(D)=1+D^2+D^3,g_1(D)=1+D+D^3}$$

Initial values of shift registers used in the 8-state element encoders 120 and 130 are all 0. Outputs of the conventional turbo encoder 100 are as follows.

$$d_k^{(0)}=x_k, d_k^{(1)}=z_k, d_k^{(2)}=z'_k{}^{k=0,1,2,\ldots,(K-1)}$$

When a code block, which should be encoded, is a $0^{th}$ code block, if the number of filler bits, which should be inserted, is larger than 0 (that is, F>0), inputs of the conventional turbo encoder 100 are $C_k=0$, k=0, ..., (F−1) and outputs are $$d_k^{(0)}=<\text{Null}>^{k=0,\ldots,(F-1)}, d_k^{(1)}=<\text{Null}>^{k=0,\ldots,(F-1)}$$

An input bitstream of the conventional turbo encoder 100 is represented as $C_0, C_1, C_2, C_3, \ldots C_{k-1}$ and output bitstreams of first and second 8-state element encoders 120 and 130 are represented as $z_0, z_1, z_2, z_3, \ldots z_{k-1}$ and $z'_0, z'_1, z'_2, z'_3, \ldots z'_{k-1}$, respectively. Outputs of the internal interleaver 110 of the turbo encoder are represented as $C'_1, C'_2, \ldots C'_{k-1}$, and $C'_0, C'_1, C'_2, \ldots C'_{k-1}$ become inputs of the second 8-state element encoder 130.

When the inputs of the internal interleaver 110 of the conventional turbo encoder 100 are $C_0, C_1, C_2, \ldots C_{k-1}$ and the outputs of the internal interleaver 110 of the conventional turbo encoder 100 are $C'_0, C'_1, C'_2, \ldots C'_{k-1}$, the relation between the input and the output is as follows.

$$C'_i=C_{\Pi(i)}{}^{i=0,1,\ldots,(K-1)}$$

In the above equation, an index of the input bistream and an index of the output bitstream are calculated as defined in the below equation.

$$\Pi(i)=(f_1*i+f_2*i^2)\bmod K$$

A trellis termination is performed by taking three shift register values indicating the state after all input bitstreams have been encoded as a final input bit. The final input bit is added to the back of the output bitstream after the input bitstreams have been fully encoded.

First three final bits should be used when the first 8-state element encoder 120 is terminated in a state where an operation of the second 8-state element encoder 130 is stopped. That is, a switch included in the first 8-state element encoder 120 is connected to a lower side.

Last three final bits should be used when the second 8-state element encoder 130 is terminated in a state where an operation of the first 8-state element encoder 120 is stopped. That is, a switch included in the second 8-state element encoder 130 is connected to a lower side.

Trellis termination bitstreams added to outputs are as follows.

$$d_k^{(0)}=x_k, d_{k+1}^{(0)}=z_{k+1}, d_{k+2}^{(0)}=x'_k, d_{k+3}^{(0)}=z'_{k+1}$$

$$d_k^{(1)}=z_k, d_{k+1}^{(1)}=x_{k+2}, k_{k+2}^{(1)}=z'_k, d_{k+3}^{(1)}=x'_{k+2}$$

$$d_k^{(2)}=x_{k+1}, d_{k+1}^{(2)}=z_{k+2}, d_{k+2}^{(2)}=x'_{k+1}, d_{k+3}^{(2)}=z'_{k+3}$$

The number of sizes (K) of input bitstreams, which can be encoded at one time, is a total of 188, and K can have values shown in the below table.

TABLE 1

| i | $K_i$ |
|---|---|
| 1 | 40 |
| 2 | 48 |
| 3 | 56 |
| 4 | 64 |
| 5 | 72 |
| 6 | 80 |
| 7 | 88 |
| 8 | 96 |
| 9 | 104 |
| 10 | 112 |
| 11 | 120 |
| 12 | 128 |
| 13 | 136 |
| 14 | 144 |
| 15 | 152 |
| 16 | 160 |
| 17 | 168 |
| 18 | 176 |
| 19 | 184 |
| 20 | 192 |
| 21 | 200 |
| 22 | 208 |
| 23 | 216 |
| 24 | 224 |
| 25 | 232 |
| 26 | 240 |
| 27 | 248 |
| 28 | 256 |
| 29 | 264 |
| 30 | 272 |
| 31 | 280 |
| 32 | 288 |
| 33 | 296 |
| 34 | 304 |
| 35 | 312 |
| 36 | 320 |
| 37 | 328 |
| 38 | 336 |
| 39 | 344 |
| 40 | 352 |
| 41 | 360 |
| 42 | 368 |
| 43 | 376 |
| 44 | 384 |
| 45 | 392 |
| 46 | 400 |
| 47 | 408 |
| 48 | 416 |
| 49 | 424 |
| 50 | 432 |
| 51 | 440 |
| 52 | 448 |
| 53 | 456 |
| 54 | 464 |
| 55 | 472 |
| 56 | 480 |
| 57 | 488 |
| 58 | 496 |
| 59 | 504 |
| 60 | 512 |

TABLE 1-continued

| i | $K_i$ |
|---|---|
| 61 | 528 |
| 62 | 544 |
| 63 | 560 |
| 64 | 576 |
| 65 | 592 |
| 66 | 608 |
| 67 | 624 |
| 68 | 640 |
| 69 | 656 |
| 70 | 672 |
| 71 | 688 |
| 72 | 704 |
| 73 | 720 |
| 74 | 736 |
| 75 | 752 |
| 76 | 768 |
| 77 | 784 |
| 78 | 800 |
| 79 | 816 |
| 80 | 832 |
| 81 | 848 |
| 82 | 864 |
| 83 | 880 |
| 84 | 896 |
| 85 | 912 |
| 86 | 928 |
| 87 | 944 |
| 88 | 960 |
| 89 | 976 |
| 90 | 992 |
| 91 | 1008 |
| 92 | 1024 |
| 93 | 1056 |
| 94 | 1088 |
| 95 | 1120 |
| 96 | 1152 |
| 97 | 1184 |
| 98 | 1216 |
| 99 | 1248 |
| 100 | 1280 |
| 101 | 1312 |
| 102 | 1344 |
| 103 | 1376 |
| 104 | 1408 |
| 105 | 1440 |
| 106 | 1472 |
| 107 | 1504 |
| 108 | 1536 |
| 109 | 1568 |
| 110 | 1600 |
| 111 | 1632 |
| 112 | 1664 |
| 113 | 1696 |
| 114 | 1728 |
| 115 | 1760 |
| 116 | 1792 |
| 117 | 1824 |
| 118 | 1856 |
| 119 | 1888 |
| 120 | 1920 |
| 121 | 1952 |
| 122 | 1984 |
| 123 | 2016 |
| 124 | 2048 |
| 125 | 2112 |
| 126 | 2176 |
| 127 | 2240 |
| 128 | 2304 |
| 129 | 2368 |
| 130 | 2432 |
| 131 | 2496 |
| 132 | 2560 |
| 133 | 2624 |
| 134 | 2688 |
| 135 | 2752 |
| 136 | 2816 |
| 137 | 2880 |
| 138 | 2944 |
| 139 | 3008 |
| 140 | 3072 |
| 141 | 3136 |
| 142 | 3200 |
| 143 | 3264 |
| 144 | 3328 |
| 145 | 3392 |
| 146 | 3456 |
| 147 | 3520 |
| 148 | 3584 |
| 149 | 3648 |
| 150 | 3712 |
| 151 | 3776 |
| 152 | 3840 |
| 153 | 3904 |
| 154 | 3968 |
| 155 | 4032 |
| 156 | 4096 |
| 157 | 4160 |
| 158 | 4224 |
| 159 | 4288 |
| 160 | 4352 |
| 161 | 4416 |
| 162 | 4480 |
| 163 | 4544 |
| 164 | 4608 |
| 165 | 4672 |
| 166 | 4736 |
| 167 | 4800 |
| 168 | 4864 |
| 169 | 4928 |
| 170 | 4992 |
| 171 | 5056 |
| 172 | 5120 |
| 173 | 5184 |
| 174 | 5248 |
| 175 | 5312 |
| 176 | 5376 |
| 177 | 5440 |
| 178 | 5504 |
| 179 | 5568 |
| 180 | 5632 |
| 181 | 5696 |
| 182 | 5760 |
| 183 | 5824 |
| 184 | 5888 |
| 185 | 5952 |
| 186 | 6016 |
| 187 | 6080 |
| 188 | 6144 |

A maximum size (K) of the code block is 6144 bits. In this case, the time spent for generating an output bitstream by encoding an input bitstream corresponds to a 6144+3+3 clock cycle in the implementation of hardware. When the time is calculated based on a basic sampling frequency (30.72 MHz) in LTE or LTE-Advanced, the time of about 200.2 us is required and the time corresponds to one subframe of about 20%.

Further, three code blocks, which are outputs of the conventional turbo encoder 100, should be converted to a structure body in the unit of 32 bits before entering a rate matching, which is a next signal processing step, and insufficient bits are filled with null bit.

However, the conventional turbo encoder 100 takes a long time for encoding since the conventional turbo encoder 100 performs the encoding in the unit of bits.

DISCLOSURE OF INVENTION

Technical Problem

An aspect of the present invention provides a turbo encoder apparatus, which is implemented to perform an encoding in the unit of plural bits and reconstructs forms of an input bitstream and an output bitstream satisfying a code block size and a trellis termination method are satisfied.

Solution to Problem

In accordance with an aspect of the present invention, there is provided a turbo encoder apparatus for receiving an input of data and outputting encoded bitstreams, the turbo encoder apparatus including a first element encoder for receiving an input of a bitstream of the data, which has a size of a designated code block and in which a padding has been implemented, in the unit of plural bits, encoding the input of the bitstream of the data, and generating a first output bitstream in the unit of plural bits; an internal interleaver for generating an interleaved input bitstream from the bitstream of the data; a second element encoder for receiving an input of the interleaved input bitstream in the unit of plural bits, encoding the input of the interleaved input bitstream, and generating a second output bitstream in the unit of plural bits; a trellis termination encoder for generating bits for trellis terminations of the first element encoder and the second element encoder; and a bitstream assembling apparatus for receiving the first output bitstream, the second output bitstream, and the bits for the trellis terminations and generating an input bitstream for a rate matching.

The first element encoder and the second element encoder may receive an input of the bitstream of the data constructed in the unit of 8 bits, and the plural bits are 8 bits.

The first element encoder may generate the first output bitstream by using the bitstream of the data and an internal state of the first element encoder, and the second element encoder may generate the second output bitstream by using the interleaved input bitstream and an internal state of the second element encoder.

The first element encoder or the second element encoder may represent null bits, which exist in the first output bitstream or the second output bitstream in equal number to a number of filler bits existing in the bitstream of the data, as "0".

The trellis termination encoder may generate the bits for the trellis termination by using an internal state when a last input bitstream for the data is input to the first element encoder or the second element encoder.

The bitstream assembling apparatus may rearrange the input bitstream of the rate matching in such a manner that the rate matching can be performed in parallel.

The bitstream assembling apparatus may insert as many null bits as a number determined by the size of the code block into the input bitstream of the rate matching and adds the bits for the trellis termination to the first output bitstream or the second output bitstream, wherein the null bits are inserted by changing positions of upper 4 bits and lower 4 bits in a 8 bit unit of the first output bitstream or the second output bitstream, delaying the lower 4 bits by one cycle, and making the passing the lower 4 bits pass through a cycle delay circuit according to a number of null bits, which should be added.

Specific matters of other embodiments are included in the detailed description and drawings.

Advantageous Effects of Invention

The present invention has an effect of reducing the time spent for performing the encoding by enabling the encoding to be performed in the unit of plural bits every clock cycle.

Further, the present invention has an effect of performing a turbo encoding with a structure optimized for a total signal processing processor through the assembly of input forms of encoding output bitstreams in a subsequent signal processing step for encoding through the bitstream assembling apparatus.

Furthermore, the present invention has an effect of generating bits for the trellis termination in one clock cycle.

BRIEF DESCRIPTION OF DRAWINGS

The foregoing and other objects, features and advantages of the present invention will become more apparent from the following detailed description when taken in conjunction with the accompanying drawings in which.

MODE FOR THE INVENTION

The above and other objects, features and advantages of the present invention will be more apparent from the following detailed description taken in conjunction with the accompanying drawings. While the detailed description of the present invention has described certain exemplary embodiments such as a portable terminal, it will be understood by those skilled in the art that various changes in form and details may be made therein without departing from the spirit and scope of the invention as defined by the appended claims. Meanwhile, the terms used herein are only for describing embodiments of the present invention and do not limit the present invention.

Figure 2:
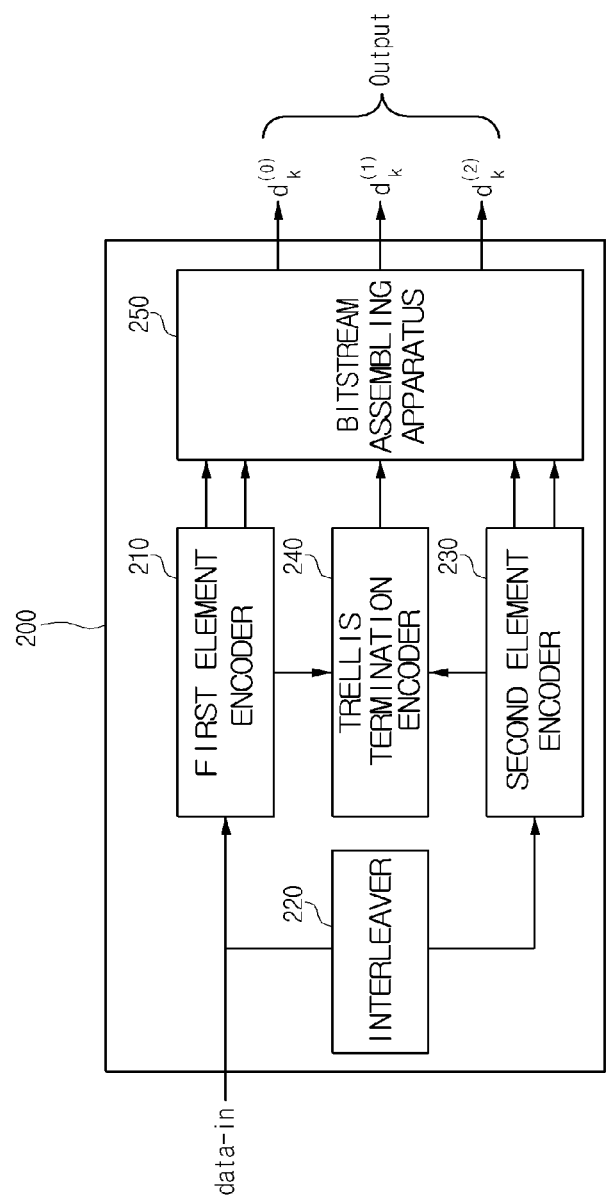
FIG. 2 is a block diagram illustrating a construction of a turbo encoder according to an embodiment of the present invention.

FIG. 2 is a block diagram illustrating a construction of a turbo encoder according to an embodiment of the present invention. Referring to FIG. 2, the turbo encoder 200 according to the embodiment of the present invention includes a first element encoder 210, an internal interleaver 220, a second element encoder 230, a trellis termination encoder 240, and a bitstream assembling apparatus 250, and receives an input of data to generate and output an encoded bitstream for the input data.

The first element encoder 210 has a size of a designated code block. The first element encoder 210 receives an input of a bitstream of input data in which the padding is performed, in the unit of plural bits to perform an encoding and generates a first output bitstream in the unit of plural bits.

When the bitstream of the input data is C $(0, \ldots, n)$, the first output bitstream becomes a bitstream X $(0, \ldots, n)$ and a bitstream Z $(0, \ldots, n)$.

It is preferable that the first element encoder 210 includes an internal register and a state of an initial register is "000".

It is preferable that the first element encoder 210 receives the bitstream of the input data in the unit of plural bits. For example, the input data may be input to the first element encoder 210 in the unit of plural bits after the input data is divided in the unit of plural bits through a means for generating the bitstream of the input data in the unit of plural bits before the input data is input to the first element encoder 210.

Figure 3:
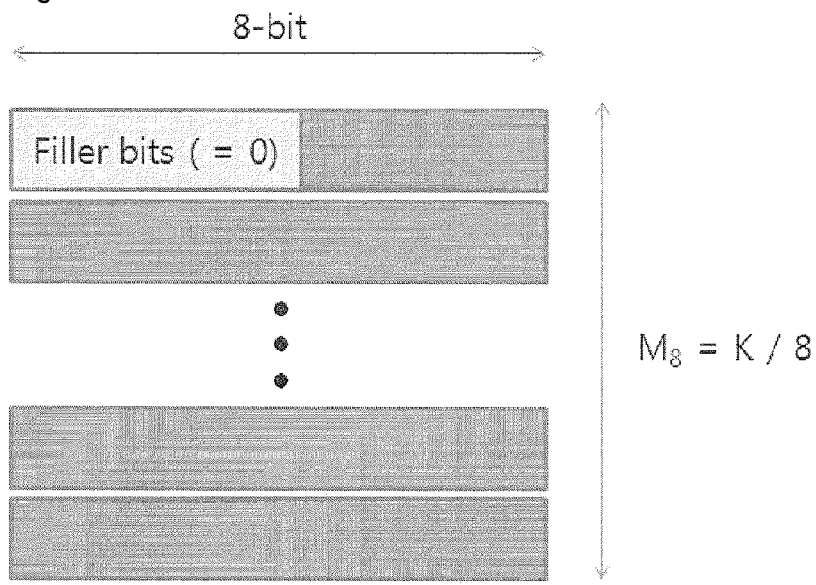
FIG. 3 is a block diagram illustrating a structure of an input bitstream according to an embodiment of the present invention.

FIG. 3 is a block diagram illustrating a structure of an input bitstream according to an embodiment of the present invention. Referring to FIG. 3, when a size of data input to the turbo encoder 200 is C, the first element encoder 210 receives an input of an input bitstream having the same number of filler bits existing in the front of the input data as the number of F, which has no remainder when C is divided by 8. At this time, the filler bit may be "0".

That is, the size of the data bitstream input to the first element encoder 210 corresponds to a sum of the size (c) of the data input to the turbo encoder 200 and the number (F) of filler bits existing in the front of the data, and also corresponds to a value generated by multiplying the number ($M_8$) of input bitstreams and 8. Further, the size of the data bitstream is a maximum of 6144 and can have only a value of Ki defined in Table 1.

Referring back to FIG. 2, according to another exemplary embodiment of the present invention, the first element encoder 210 generates the first output bitstream by using the bitstream of input data and an internal state.

The internal state of the first element encoder 210 refers to a state of the internal register included in the first element encoder 210.

The first element encoder 210 operates the state of the internal register while encoding the bitstream of the input data.

Figure 1:
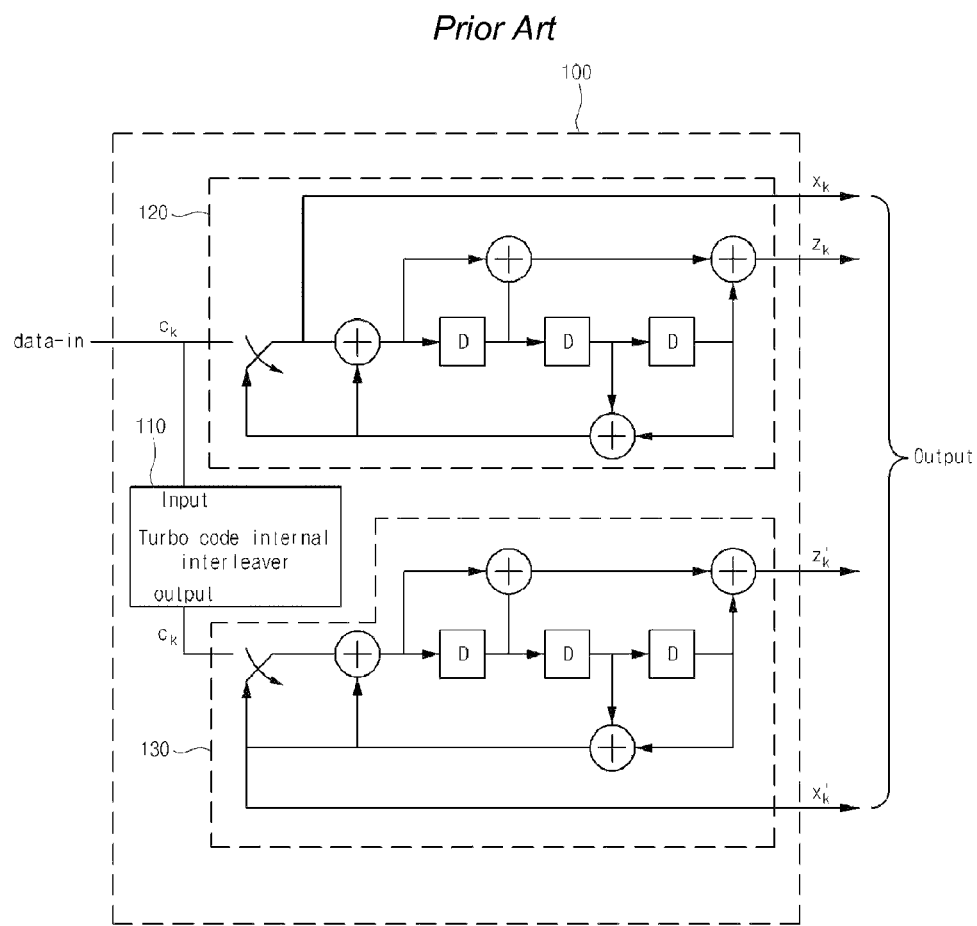
FIG. 1 is a block diagram illustrating a construction of the conventional turbo encoder.

It is preferable that the first element encoder 210 can generate first output bitstreams Z(n), Z(n+1), Z(n+2), Z(n+3), Z(n+4), Z(n+5), Z(n+6), Z(n+7) or X(n), X(n+1), X(n+2), X(n+3), X(n+4), X(n+5), X(n+6), X(n+7) when the bitstreams of the input data correspond to C(n), C(n+1), C(n+2), C(n+3), C(n+4), C(n+5), C(n+6), C(n+7) and the internal states of the first element encoder 210 correspond to $D_0(n)$, $D_1(n)$, $D_2(n)$. The first element encoder 210 uses an encoding method shown in FIG. 1.

$$X(n) = C(n)$$
$$Z(n) = C(n) + D_0(n) + D_1(n)$$

$$X(n+1) = C(n+1)$$
$$Z(n+1) = C(n+1) + D_0(n+1) + D_1(n+1)$$
$$= C(n+1) + C(n) + D_1(n) + D_2(n) + D_1(n+1)$$
$$= C(n+1) + C(n) + D_1(n) + D_2(n) + D_0(n)$$

$$X(n+2) = C(n+2)$$
$$Z(n+2) = C(n+2) + D_0(n+2) + D_1(n+2)$$
$$= C(n+2) + C(n+1) + D_1(n+1) + D_2(n+1) + D_1(n+2)$$
$$= C(n+2) + C(n+1) + D_0(n) + D_1(n) + D_0(n+1)$$
$$= C(n+2) + C(n+1) + D_0(n) + D_1(n) + C(n) + D_1(n) + D_2(n)$$
$$= C(n+2) + C(n+1) + C(n) + D_0(n) + D_2(n)$$

-continued $$X(n+3) = C(n+3)$$
$$Z(n+3) = C(n+3) + D_0(n+3) + D_1(n+3)$$
$$= C(n+3) + C(n+2) + D_1(n+2) + D_2(n+2) + D_1(n+3)$$
$$= C(n+3) + C(n+2) + D_0(n+1) + D_0(n) + D_0(n+2)$$
$$= C(n+3) + C(n+2) + C(n) + D_1(n) + D_2(n) + D_0(n) +$$
$$C(n+1) + D_1(n+1) + D_2(n+1)$$
$$= C(n+3) + C(n+2) + C(n+1) + C(n) + D_1(n) + D_2(n) +$$
$$D_0(n) + D_0(n) + D_1(n)$$
$$= C(n+3) + C(n+2) + C(n+1) + C(n) + D_2(n)$$

$$X(n+4) = C(n+4)$$
$$Z(n+4) = C(n+4) + D_0(n+4) + D_1(n+4)$$
$$= C(n+4) + C(n+3) + D_1(n+3) + D_2(n+3) + D_1(n+4)$$
$$= C(n+4) + C(n+3) + D_0(n+2) + D_0(n+1) + D_0(n+3)$$
$$= C(n+4) + C(n+3) + C(n+1) + D_1(n+1) + D_2(n+1) + C(n) +$$
$$D1(n) + D_2(n) + C(n+2) + D_1(n+2) + D_2(n+2)$$
$$= C(n+4) + C(n+3) + C(n+2) + C(n+1) + C(n) + D_0(n) +$$
$$D_1(n) + D_1(n) + D_2(n) + D_0(n+1) + D_0(n)$$
$$= C(n+4) + C(n+3) + C(n+2) + C(n+1) + C(n) +$$
$$D_2(n) + D_0(n+1)$$
$$= C(n+4) + C(n+3) + C(n+2) + C(n+1) + C(n) + D_2(n) +$$
$$C(n) + D_1(n) + D_2(n)$$
$$= C(n+4) + C(n+3) + C(n+2) + C(n+1) + D_1(n)$$

$$X(n+5) = C(n+5)$$
$$Z(n+5) = C(n+5) + D_0(n+5) + D_1(n+5)$$
$$= C(n+5) + C(n+4) + D_1(n+4) + D_2(n+4) + D_1(n+5)$$
$$= C(n+5) + C(n+4) + D_0(n+3) + D_0(n+2) + D_0(n+4)$$
$$= C(n+5) + C(n+4) + C(n+2) + D_1(n+2) + D_2(n+2) +$$
$$C(n+1) + D_1(n+1) + D_2(n+1) + C(n+3) + D_1(n+3) + D_2(n+3)$$
$$= C(n+5) + C(n+4) + C(n+3) + C(n+2) + C(n+1) + D_0(n+1) +$$
$$D_0(n) + D_0(n) + D_1(n) + D_0(n+2) + D_0(n+1)$$
$$= C(n+5) + C(n+4) + C(n+3) + C(n+2) + C(n+1) +$$
$$D_1(n) + D_0(n+2)$$
$$= C(n+5) + C(n+4) + C(n+3) + C(n+2) + C(n+1) + D_1(n) +$$
$$C(n+1) + D_1(n+1) + D_2(n+1)$$
$$= C(n+5) + C(n+4) + C(n+3) + C(n+2) + D_1(n) + D_0(n) + D_1(n)$$
$$= C(n+5) + C(n+4) + C(n+3) + C(n+2) + D_0(n)$$

$$X(n+6) = C(n+6)$$
$$Z(n+6) = C(n+6) + D_0(n+6) + D_1(n+6)$$
$$= C(n+6) + C(n+5) + D_1(n+5) + D_2(n+5) + D_0(n+5)$$
$$= C(n+6) + C(n+5) + D_0(n+4) + D_0(n+3) + D_0(n+5)$$
$$= C(n+6) + C(n+5) + C(n+3) + D_1(n+3) + D_2(n+3) +$$
$$C(n+2) + D_1(n+2) + D_2(n+2) + C(n+4) + D_1(n+4) + D_2(n+4)$$
$$= C(n+6) + C(n+5) + C(n+4) + C(n+3) + C(n+2) +$$
$$D_0(n+2) + D_0(n+1) + D_0(n+1) + D_0(n) + D_0(n+3) + D_0(n+2)$$
$$= C(n+6) + C(n+5) + C(n+4) + C(n+3) + C(n+2) +$$
$$D_0(n) + D_0(n+3)$$
$$= C(n+6) + C(n+5) + C(n+4) + C(n+3) + C(n+2) + D_0(n) +$$
$$C(n+2) + D_1(n+2) + D_2(n+2)$$
$$= C(n+6) + C(n+5) + C(n+4) + C(n+3) + D_0(n) +$$
$$D_0(n+1) + D_0(n)$$
$$= C(n+6) + C(n+5) + C(n+4) + C(n+3) + D_0(n+1)$$
$$= C(n+6) + C(n+5) + C(n+4) + C(n+3) + C(n) + D_1(n) + D_2(n)$$

$X(n+7) = C(n+7)$ $Z(n+7) = C(n+7) + D_0(n+7) + D_1(n+7)$
$= C(n+7) + C(n+6) + D_1(n+6) + D_2(n+6) + D_1(n+7)$
$= C(n+7) + C(n+6) + D_0(n+5) + D_0(n+4) + D_0(n+6)$
$= C(n+7) + C(n+6) + C(n+4) + D_1(n+4) + D_2(n+4) + C(n+3) + D_1(n+3) + D_2(n+3) + C(n+5) + D_1(n+5) + D_2(n+5)$
$= C(n+7) + C(n+6) + C(n+5) + C(n+4) + C(n+3) + D_0(n+3) + D_0(n+2) + D_0(n+2) + D_0(n+1) + D_0(n+4) + D_0(n+3)$
$= C(n+7) + C(n+6) + C(n+5) + C(n+4) + C(n+3) + D_0(n+1) + D_0(n+4)$
$= C(n+7) + C(n+6) + C(n+5) + C(n+4) + C(n+3) + C(n) + D_1(n) + D_2(n) + C(n+3) + D_1(n+3) + D_2(n+3)$
$= C(n+7) + C(n+6) + C(n+5) + C(n+4) + C(n) + D_1(n) + D_2(n) + D_1(n+3) + D_2(n+3)$
$= C(n+7) + C(n+6) + C(n+5) + C(n+4) + C(n) + D_1(n) + D_2(n) + D_0(n+2) + D_0(n+1)$
$= C(n+7) + C(n+6) + C(n+5) + C(n+4) + C(n) + D_1(n) + D_2(n) + C(n+1) + D_1(n+1) + D_2(n+1) + C(n) + D_1(n) + D_2(n)$
$= C(n+7) + C(n+6) + C(n+5) + C(n+4) + C(n+1) + D_1(n+1) + D_2(n+1)$
$= C(n+7) + C(n+6) + C(n+5) + C(n+4) + C(n+1) + D_0(n) + D_1(n)$

Further, it is preferable that the first element encoder 210 derives $D_0(n+8), D_1(n+8), D_2(n+8)$, which are internal states in the case of n+8 according to the below equation.

$D_0(n+8) = C(n+7) + D_1(n+7) + D_2(n+7)$
$= C(n+7) + D_0(n+6) + D_0(n+5)$
$= C(n+7) + C(n+5) + D_1(n+5) + D_2(n+5) + C(n+4) + D_1(n+4) + D_2(n+4)$
$= C(n+7) + C(n+5) + C(n+4) + D_1(n+5) + D_2(n+5) + D_1(n+4) + D_2(n+4)$
$= C(n+7) + C(n+5) + C(n+4) + D_0(n+4) + D_1(n+4) + D_1(n+4) + D_0(n+2)$
$= C(n+7) + C(n+5) + C(n+4) + D_0(n+4) + D_0(n+2)$
$= C(n+7) + C(n+5) + C(n+4) + C(n+3) + D_1(n+3) + D_2(n+3) + C(n+1) + D_1(n+1) + D_2(n+1)$
$= C(n+7) + C(n+5) + C(n+4) + C(n+3) + C(n+1) + D_0(n+2) + D_0(n+1) + D_0(n) + D_1(n)$
$= C(n+7) + C(n+5) + C(n+4) + C(n+3) + C(n+1) + D_0(n) + D_1(n) + C(n+1) + D_1(n+1) + D_2(n+1) + C(n) + D_1(n) + D_2(n)$
$= C(n+7) + C(n+5) + C(n+4) + C(n+3) + C(n) + D0(n) + D_1(n) + D_0(n) + D_1(n) + D_1(n) + D_2(n)$
$= C(n+7) + C(n+5) + C(n+4) + C(n+3) + C(n) + D_1(n) + D_2(n)$ $D_1(n+8) = D_0(n+7)$
$= C(n+6) + D_1(n+6) + D_2(n+6)$
$= C(n+6) + D_0(n+5) + D_0(n+4)$
$= C(n+6) + C(n+4) + D_1(n+4) + D_2(n+4) + C(n+3) + D_1(n+3) + D_2(n+3)$
$= C(n+6) + C(n+4) + C(n+3) + D_0(n+3) + D_1(n+3) + D_1(n+3) + D_0(n+1)$
$= C(n+6) + C(n+4) + C(n+3) + D_0(n+3) + D_0(n+1)$
$= C(n+6) + C(n+4) + C(n+3) + C(n+2) + D_1(n+2) + D_2(n+2) + C(n) + D_1(n) + D_2(n)$
$= C(n+6) + C(n+4) + C(n+3) + C(n+2) + C(n) + D_0(n+1) + D_0(n) + D_1(n) + D_2(n)$
$= C(n+6) + C(n+4) + C(n+3) + C(n+2) + C(n) + C(n) + D_1(n) + D_2(n) + D_0(n) + D_1(n) + D_2(n)$
$= C(n+6) + C(n+4) + C(n+3) + C(n+2) + D_1(n) + D_2(n) + D_0(n) + D_1(n) + D_2(n)$
$= C(n+6) + C(n+4) + C(n+3) + C(n+2) + D_0(n)$ $D_2(n+8) = D_0(n+6)$
$= C(n+5) + D_1(n+5) + D_2(n+5)$
$= C(n+5) + D_0(n+4) + D_0(n+3)$
$= C(n+5) + C(n+3) + D_1(n+3) + D_2(n+3) + C(n+2) + D_1(n+2) + D_2(n+2)$
$= C(n+5) + C(n+3) + C(n+2) + D_0(n+2) + D_0(n+1) + D_0(n+1) + D_0(n)$
$= C(n+5) + C(n+3) + C(n+2) + D_0(n+2) + D_0(n)$
$= C(n+5) + C(n+3) + C(n+2) + C(n+1) + D_1(n+1) + D_2(n+1) + D_0(n)$
$= C(n+5) + C(n+3) + C(n+2) + C(n+1) + D_0(n) + D_1(n) + D_0(n)$
$= C(n+5) + C(n+3) + C(n+2) + C(n+1) + D_1(n)$

The above equation may be organized as defined in the below table. "V" shown in the table refers to an Exclusive-OR operation.

TABLE 2

|  | C(n+7) | C(n+6) | C(n+5) | C(n+4) | C(n+3) | C(n+2) | C(n+1) | C(n) | $D_2(n)$ | $D_1(n)$ | $D_0(n)$ |
|---|---|---|---|---|---|---|---|---|---|---|---|
| Z(n) |  |  |  |  |  |  |  | V |  | V | V |
| Z(n+1) |  |  |  |  |  |  | V | V | V | V | V |
| Z(n+2) |  |  |  |  |  | V | V | V | V |  | V |
| Z(n+3) |  |  |  |  | V | V | V | V |  |  |  |
| Z(n+4) |  |  |  | V | V | V | V |  |  | V |  |
| Z(n+5) |  |  | V | V | V | V |  |  |  |  | V |
| Z(n+6) |  | V | V | V | V |  |  | V | V | V |  |
| Z(n+7) | V | V | V | V |  |  | V |  |  | V | V |

TABLE 2-continued

| | C(n + 7) | C(n + 6) | C(n + 5) | C(n + 4) | C(n + 3) | C(n + 2) | C(n + 1) | C(n) | D$_2$(n) | D$_1$(n) | D$_0$(n) |
|---|---|---|---|---|---|---|---|---|---|---|---|
| D$_0$(n + 8) | V | | V | V | V | | | V | V | V | |
| D$_1$(n + 8) | | V | | V | V | V | | | | | V |
| D$_2$(n + 8) | | | V | | V | V | V | | | V | |

Figure 6:
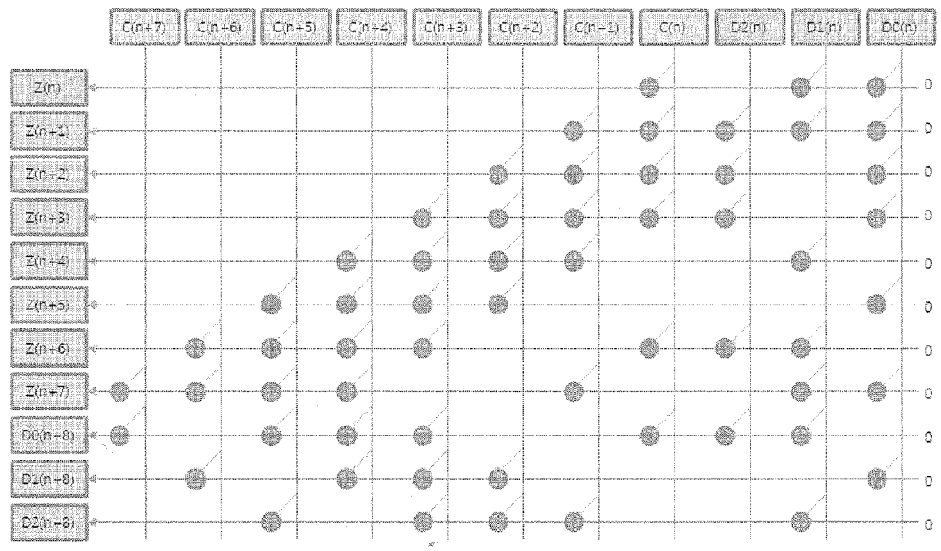
FIG. 6 is a block diagram illustrating a construction of an element encoder circuit according to an embodiment of the present invention.
Figure 7:
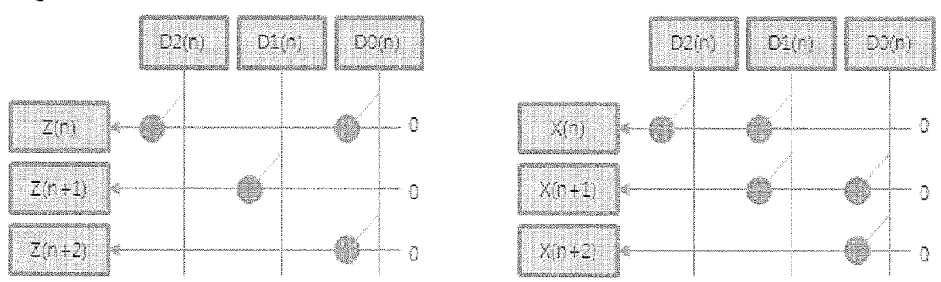
FIG. 7 is a block diagram illustrating a construction of a trellis termination encoder circuit according to an embodiment of the present invention.

FIG. 6 is a block diagram illustrating a construction of an element encoder circuit according to an embodiment of the present invention. The element encoder circuit illustrated in FIG. 6 shows an example of deriving output bitstreams Z(n), Z(n+1), Z(n+2), Z(n+3), Z(n+4), Z(n+5), Z(n+6), Z(n+7) and subsequent internal states D$_0$(n+8), D$_1$(n+8), D$_2$(n+8) by using the aforementioned inputs C(n), C(n+1), C(n+2), C(n+3), C(n+4), C(n+5), C(n+6), C(n+7) and internal states D$_0$(n), D$_1$(n), D$_2$(n).

Referring back to FIG. 2, the first element encoder 210 receives an input of input bitstreams having the form shown in FIG. 3 and generates output bitstreams including the same number of null bits as the number of filler bits existing in the input bitstreams.

According to an exemplary embodiment of the present invention, the first element encoder 210 represents the null bit as "0".

There are several methods to represent the null bit, but the null bit is represented herein as "0" in order to facilitate a next step of the signal processing of the turbo encoder. Thereafter, the null bit and the "0" bit are discriminated through the number of "0" which is inserted into the input bitstream.

Referring back to FIG. 2, the internal interleaver 220 receives data input to the turbo encoder 200 and generates an interleaved input bitstream.

It is preferable that the internal interleaver 220 is configured to generate the interleaved input bitstream in the unit of plural bits.

The second element encoder 230 receives an input of the interleaved input bitstream generated through the internal interleaver 220 in the unit of plural bits to encode the interleaved input bistream and generates a second output bitstream in the unit of plural bits.

The second element encoder 230 has the same construction as that of the first element encoder 210 but the input data bitstream and the output bitstream transmitted to the bitstream assembling apparatus 250 are only different.

The difference of the output bistream of the second element encoder 230 from the first element encoder 210 means that the output bitstreams transmitted to the bitstream assembling apparatus 250 by the first element encoder 210 are both of operated X(n) and Z(n) but the output bitstream transmitted to the bitstream assembling apparatus 250 by the second element encoder 230 is only X'(n) between operated X'(n) and Z'(n).

The trellis termination encoder 240 generates a bit for the trellis termination of the first element encoder 210 and the second element encoder 230.

According to an exemplary embodiment of the present invention, the trellis termination encoder 240 generates the bit for the trellis termination by using an internal state of the first encoder 210 or the second element encoder 230 when the last input bitstream for the input data is input to the first element encoder 210 or the second element encoder 230.

For example, when the internal states of the first element encoder 210 or the second element encoder 230 in a state where the last input bitstream for the input data is input to the first element encoder 210 or the second element encoder 230 are D$_0$(n), D$_1$(n), D$_2$(n), the trellis termination encoder 240 generates Z(n), Z(n+1), Z(n+2), X(n), X(n+1), X(n+2) according to the below equation. A first value input to the first element encoder 210 or the second element encoder 230 is "0", so D0(n+1)=D1(n+2)=0.

$$X(n) = D_1(n) + D_2(n)$$
$$Z(n) = D_0(n) + D_2(n)$$

$$X(n + 1) = D_1(n + 1) + D_2(n + 1)$$
$$= D_0(n) + D_1(n)$$
$$Z(n + 1) = D_0(n + 1) + D_2(n + 1)$$
$$= 0 + D_1(n)$$
$$= D_1(n)$$

$$X(n + 2) = D_1(n + 2) + D_2(n + 2)$$
$$= D_0(n + 1) + D_0(n)$$
$$= D_0(n)$$
$$Z(n + 2) = D_0(n + 2) + D_2(n + 2)$$
$$= 0 + D_0(n)$$
$$= D_0(n)$$

It is preferable that bits for the trellis termination are 12 bits and the trellis termination encoder 240 can generate bits for the trellis termination during one clock cycle.

The bitstream assembling apparatus 250 receives the first output bitstream from the first element encoder 210, receives the second output bitstream from the second element encoder 230, and receives the bits for the trellis termination from the trellis termination encoder 240 to generate the input bitstream used in the rate matching.

It is preferable that the input bitstreams, which are used in the rate matching, generated by the bitstream assembling apparatus 250 are three bitstreams in the unit of bytes.

Figure 4:
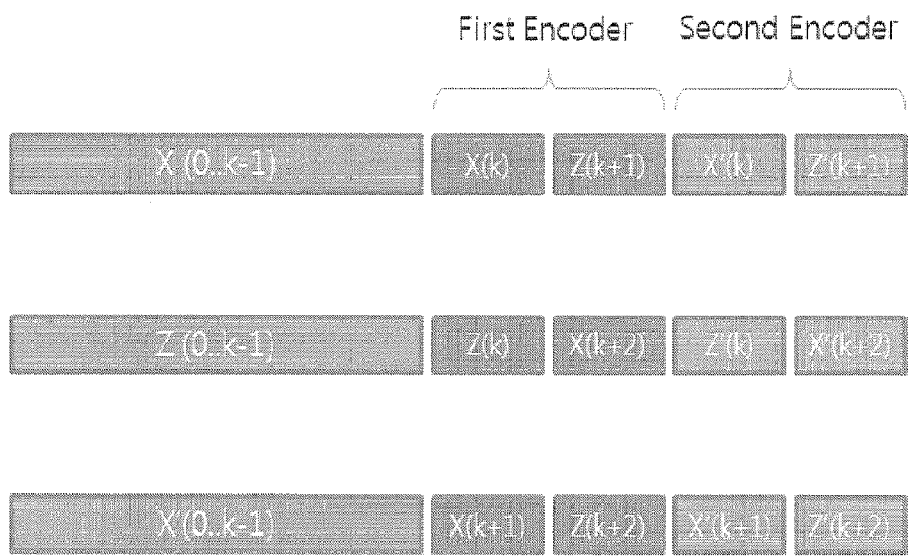
FIG. 4 is a block diagram illustrating a structure of a bitstream input to a bitstream assembling apparatus according to an embodiment of the present invention.

FIG. 4 is a block diagram illustrating a structure of a bitstream input to a bitstream assembling apparatus according to an embodiment of the present invention. Referring to FIG. 4, the bitstream assembling apparatus 250 receives an input of the first output bitstreams X(n) and Z(n) from the first element encoder, receives an input of the second output bitstream X'(n) from the second element encoder 230, and receives an input of the bits for the trellis termination from the trellis termination encoder 220.

It is preferable that the bitstream assembling apparatus 250 adds four bits for the trellis termination to each of the first output bitstreams and the second output bitstream, respectively as shown in FIG. 4.

Figure 5:
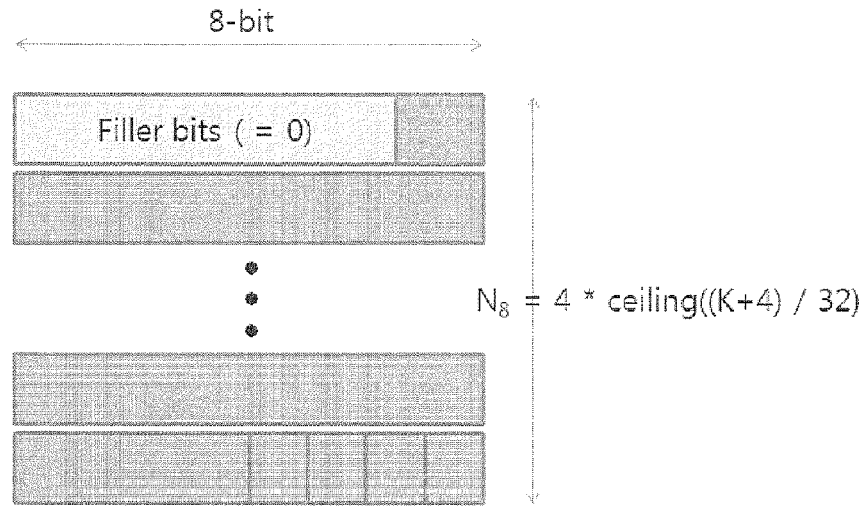
FIG. 5 is a block diagram illustrating a structure of an output bitstream of a bitstream assembling apparatus according to an embodiment of the present invention.

FIG. 5 is a block diagram illustrating a structure of an output bitstream of a bitstream assembling apparatus according to an embodiment of the present invention. Referring to FIG. 5, the bitstream assembling apparatus 250 connects the bits for the trellis termination to X(0, . . . , k−1) and Z(0, . . . , k−1) received from the first output bitstreams and X'(0, ..., k−1) received from the second output bistream and generates a final output structure.

It is preferable that the bitstream assembling apparatus 250 divides 12 bit information generated by the trellis termination encoder 240 into three 4 bit information pieces. Further, the bitstream assembling apparatus 250 connects each of the divided 4 bits to the three final output bitstreams and adds null bits to the fronts of the output bitstreams such that the output bitstreams become structure bodies having the unit of 4 bytes.

It is preferable that the bitstream assembling apparatus 250 receives the first output bitstreams, the second output bitstream, and the bits for the trellis termination to make them become structure bodies having the unit of 32 bits and can be constructed such that they become structure bodies having the unit of 8 bits for an 8 bit unit processing.

Figure 8:
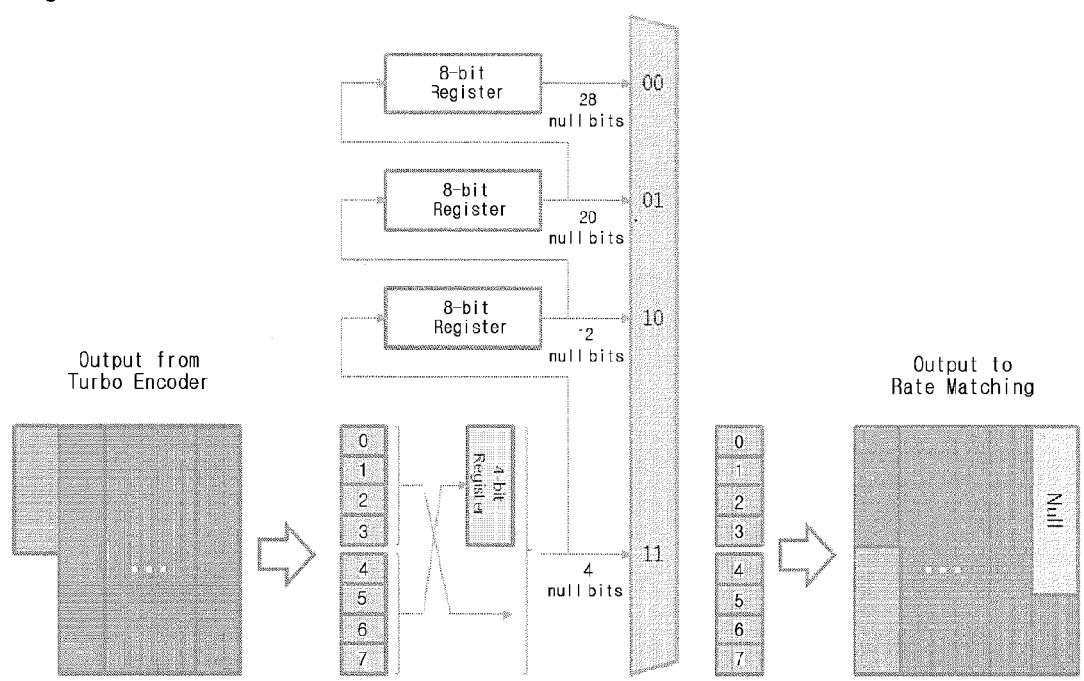
FIG. 8 is a block diagram illustrating a construction of a bitstream assembling apparatus according to an embodiment of the present invention.

FIG. 8 is a block diagram illustrating a construction of a bitstream assembling apparatus according to an embodiment of the present invention. Referring to FIG. 8, the bitstream assembling apparatus 250 delays lower 4 bits in the 8 bit unit by one cycle in order to construct 4 bits, which are the bits for the trellis termination, in the 8 bit unit by using the register. Further, bitstream assembling apparatus 250 detects third and fourth bits when added null bits according to a value of K are represented by a binary number and uses the detected bits as multiplexer control bits, and thus null bits, which are 4, 12, 20, or 28 bits, are inserted.

That is, the number of null bits is 32−(K+4) mod 32.

It is preferable that the bitstream assembling apparatus 250 can use a delay register in the unit of 8 bits including a D-flip flop (D-type flip flop).

While the detailed description of the present invention has described certain exemplary embodiments such as a portable terminal, it will be understood by those skilled in the art that various changes in form and details may be made therein without departing from the spirit and scope of the invention as defined by the appended claims.

REFERENCE NUMERALS

200: Turbo Encoder Apparatus 210: First Element Encoder
220: Internal Interleaver 230: Second Element Encoder
240: Trellis Termination Encoder 250: Bitstream Assembling Apparatus

The invention claimed is:

1. A turbo encoder apparatus for receiving an input of data and outputting encoded bitstreams, the turbo encoder apparatus comprising:
   a first element encoder for receiving an input of a bitstream of the data, which has a size of a designated code block and in which a padding has been implemented, in the unit of plural bits, encoding the input of the bitstream of the data, and generating a first output bitstream in the unit of plural bits;
   an internal interleaver for generating an interleaved input bitstream from the bitstream of the data;
   a second element encoder for receiving an input of the interleaved input bitstream in the unit of plural bits, encoding the input of the interleaved input bitstream, and generating a second output bitstream in the unit of plural bits;
   a trellis-termination-encoder for generating bits for trellis terminations of the first element encoder and the second element encoder; and
   a bitstream assembler for receiving the first output bitstream, the second output bitstream, and the bits for the trellis terminations and generating an input bitstream for a rate matching.

2. The turbo encoder apparatus as claimed in claim 1, wherein the first element encoder and the second element encoder receive an input of the bitstream of the data constructed in the unit of 8 bits, and the plural bits are 8 bits.

3. The turbo encoder apparatus as claimed in claim 2, wherein the first element encoder generates the first output bitstream by using the bitstream of the data and an internal state of the first element encoder, and the second element encoder generates the second output bitstream by using the interleaved input bitstream and an internal state of the second element encoder.

4. The turbo encoder apparatus as claimed in claim 2, wherein the first element encoder or the second element encoder represents null bits, which exist in the first output bitstream or the second output bitstream in equal number to a number of filler bits existing in the bitstream of the data, as "0".

5. The turbo encoder apparatus as claimed in claim 1, wherein the trellis termination encoder generates the bits for the trellis termination by using an internal state when a last input bitstream for the data is inputted to the first element encoder or the second element encoder.

6. The turbo encoder apparatus as claimed in claim 2, wherein the bitstream assembler rearranges the input bitstream of the rate matching so the rate matching could be performed in parallel.

7. The turbo encoder apparatus as claimed in claim 6, wherein the bitstream assembling apparatus inserts as many null bits as a number determined by the size of the code block into the input bitstream of the rate matching and adds the bits for the trellis termination to the first output bitstream or the second output bitstream,
   wherein the null bits are inserted by changing positions of upper 4 bits and lower 4 bits in a 8 bit unit of the first output bitstream or the second output bitstream, delaying the lower 4 bits by one cycle, and making the lower 4 bits pass through a cycle delay circuit according to a number of null bits, which should be added.

* * * * *